United States Patent
Moharir

(10) Patent No.: US 10,014,065 B1
(45) Date of Patent: Jul. 3, 2018

(54) PPA (POWER PERFORMANCE AREA) EFFICIENT ARCHITECTURE FOR ROM (READ ONLY MEMORY) AND A ROM BITCELL WITHOUT A TRANSISTOR

(71) Applicant: Skan Technologies Corporation, Willowbrook, IL (US)

(72) Inventor: Sudhir S. Moharir, Bangalore (IN)

(73) Assignee: SKAN TECHNOLOGIES CORPORATION, Willowbrook, IL (US)

( * ) Notice: Subject to any disclaimer, the term of this patent is extended or adjusted under 35 U.S.C. 154(b) by 179 days.

(21) Appl. No.: 15/068,733

(22) Filed: Mar. 14, 2016

Related U.S. Application Data

(60) Provisional application No. 62/132,829, filed on Mar. 13, 2015.

(51) Int. Cl.
- *G11C 15/04* (2006.01)
- *G11C 17/00* (2006.01)
- *G11C 17/08* (2006.01)

(52) U.S. Cl.
CPC .................. *G11C 17/08* (2013.01)

(58) Field of Classification Search
CPC ............ G11C 16/04; G11C 7/00; G11C 11/418–11/419; G11C 15/04
See application file for complete search history.

(56) References Cited

U.S. PATENT DOCUMENTS

| | | | | |
|---|---|---|---|---|
| 6,594,812 B2 * | 7/2003 | Wang | | G11C 17/00 |
| | | | | 257/E27.102 |
| 7,327,593 B2 * | 2/2008 | Ostermayr | | G11C 17/12 |
| | | | | 257/E21.673 |
| RE41,734 E * | 9/2010 | Sedlak | | G11C 16/0416 |
| | | | | 365/185.05 |
| 9,697,888 B1 * | 7/2017 | Moharir | | G11C 11/419 |
| 2002/0181269 A1 * | 12/2002 | Jeung | | G11C 17/126 |
| | | | | 365/94 |
| 2003/0185044 A1 * | 10/2003 | Nii | | G11C 8/16 |
| | | | | 365/154 |
| 2007/0230251 A1 * | 10/2007 | Ajika | | G11C 11/5671 |
| | | | | 365/185.23 |
| 2010/0054039 A1 * | 3/2010 | Kim | | G11C 7/067 |
| | | | | 365/185.13 |
| 2010/0214824 A1 * | 8/2010 | Chang | | G11C 11/412 |
| | | | | 365/156 |
| 2012/0163063 A1 * | 6/2012 | Dasani | | H01L 27/11226 |
| | | | | 365/104 |
| 2015/0138870 A1 * | 5/2015 | Joo | | G11C 7/04 |
| | | | | 365/104 |

* cited by examiner

*Primary Examiner* — Hien Nguyen
(74) *Attorney, Agent, or Firm* — Anderson Gorecki LLP

(57) ABSTRACT

Described herein is a ROM architecture featuring a ROM bitcell without a transistor, a ROM architecture wherein the bitcell device gate goes to a column address and the local bitline is sensed per row per mux, a ROM architecture wherein the bitcell device gate goes to the column address and the full row of bitcells is enabled by a row enable signal, and a ROM architecture wherein the bitcell device gate goes to the row address and the full column of bitcells is enabled by a column enable signal. The presently described architectures provide large advantages in terms of PPA.

17 Claims, 9 Drawing Sheets

PPA (POWER PERFORMANCE AREA) EFFICIENT ARCHITECTURE FOR ROM (READ ONLY MEMORY) AND A ROM BITCELL WITHOUT A TRANSISTOR

CROSS REFERENCE TO RELATED APPLICATIONS

The present application claims priority U.S. Provisional Patent Application No. 62/132,829 filed on Mar. 13, 2015; and is related to U.S. Provisional Patent Application No. 62/098,492 filed on Dec. 31, 2014 and to U.S. Provisional Patent Application No. 62/120,002 filed on Feb. 24, 2015 both of which are incorporated herein by reference in their entirety.

BACKGROUND

One type of memory is known as a Read Only Memory (ROM). A conventional ROM bitcell consists of a single NMOS transistor. The bitline (BL) is pre-charged high. When the wordline (WL) goes high, if a "zero" is stored in the bitcell, the bitline will fall. If a "one" is stored in the bitcell, the bitline will stay high. This bitline is then sensed to complete the read operation. A "zero" is stored in the bitcell when all the connections are intact and the transistor turns ON when the WL goes high. A "one" is stored when one of the three possible connections is broken and even if the WL goes high, the BL will not be pulled low.

There are basically three types of ROMs that exist. These include a Diffusion ROM or DiffROM shown in FIG. 1, wherein the "G" (gate) is broken or not formed. This is done by removing the diffusion under the gate contact. This is diffusion programmable ROM. Another type of Rom is known as a Via ROM. In a Via ROM, typically the connection between "D" (drain) and BL is broken by removing a via. This via could be via1, via2, via3, etc. This is via programmable ROM. A third type of ROM is known as a Contact ROM. In a Contact ROM, typically the connection between "S" (source) and VSS is broken using a contact between diffusion and metal1. Note that the WL is always connected to the "G" (gate) terminal of the transistor.

The conventional architecture that is used with these bitcells has row decoders that select a WL. The bitlines are pre-charged high before the WL goes high. Once the WL goes high, if a "zero" is stored into the bitcell, the BL will fall, otherwise it will stay high. The bitlines in a mux are muxed at the bottom of the core array. For example, if the column mux is 8, then one active BL out of the 8 bitlines in a mux is routed to the input of the sense amplifier. The sense amplifier thus gives one bit output Q per mux.

SUMMARY

Conventional ROMs suffer from a number of deficiencies as recited above. Embodiments of the invention significantly overcome such deficiencies by providing a ROM bitcell without a transistor and a corresponding architecture. The ROM architecture further features a bitcell device wherein the gate goes to a column address and the local bitline is sensed per row per mux, a ROM architecture wherein the bitcell device gate goes to the column address and the full row of bitcells is enabled by a row enable signal, and a ROM architecture wherein the bitcell device gate goes to the row address and the full column of bitcells is enabled by a column enable signal. The presently described architecture provides large advantages in terms of Performance, Power, and Area (PPA).

Note that each of the different features, techniques, configurations, etc. discussed in this disclosure can be executed independently or in combination. Accordingly, the present invention can be embodied and viewed in many different ways. Also, note that this summary section herein does not specify every embodiment and/or incrementally novel aspect of the present disclosure or claimed invention. Instead, this summary only provides a preliminary discussion of different embodiments and corresponding points of novelty over conventional techniques. For additional details, elements, and/or possible perspectives (permutations) of the invention, the reader is directed to the Detailed Description section and corresponding figures of the present disclosure as further discussed below.

BRIEF DESCRIPTION OF THE DRAWINGS

The foregoing will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Figure 1:
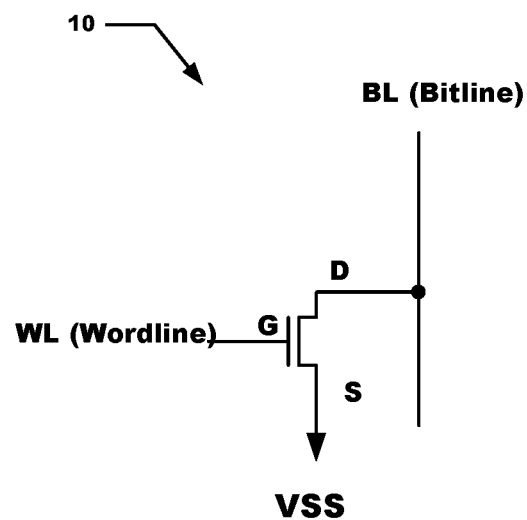
FIG. 1 depicts a schematic diagram of a conventional ROM bitcell.

The embodiments set forth below represent the necessary information to enable those skilled in the art to practice the invention and illustrate the best mode of practicing embodiments of the invention. Upon reading the following description in light of the accompanying figures, those skilled in the art will understand the concepts of the invention and recognize applications of these concepts not particularly addressed herein. It should be understood that these concepts and applications fall within the scope of the disclosure and the accompanying claims.

The preferred embodiment of the invention will now be described with reference to the accompanying drawings. The invention may, however, be embodied in many different forms and should not be construed as limited to the embodiment set forth herein; rather, this embodiment is provided so that this disclosure will be thorough and complete, and will fully convey the scope of the invention to those skilled in the art. The terminology used in the detailed description of the particular embodiment illustrated in the accompanying drawings is not intended to be limiting of the invention. In the drawings, like numbers refer to like elements.

Figure 2:
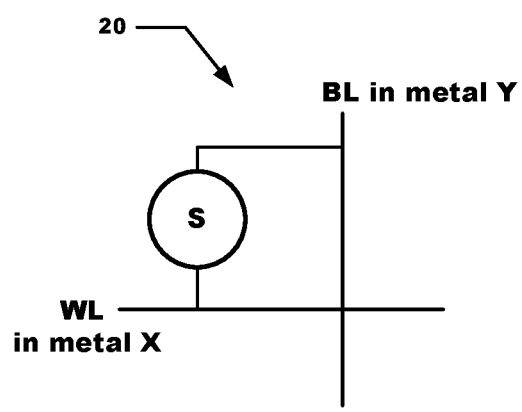
FIG. 2 depicts a schematic diagram of a ROM bitcell without a transistor in accordance with a particular embodiment of the present invention.

Referring to FIG. 2, a schematic diagram shows a particular embodiment of a ROM bitcell 20 which does not use any transistor at all. WL is in metalX. For all practical purposes, this metalX could be any metal; for example, metal1, metal2, metal3, etc. Actually, it could be any routing track in any material. BL is in metalY. For all practical purposes, metalY could be any routing track in any metal or material excluding that of metalX at the intersection. The switch "S" could be in any metal or material or be in any of the via or contact layers. The purpose of the "S" is to either connect metalX with metalY or not connect metalX and metalY. So this ROM is "S" programmable where S can take multiple values including different metals and vias.

Figure 3:
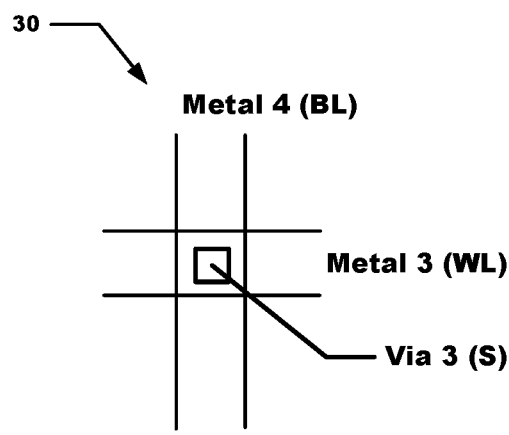
FIG. 3 depicts a schematic diagram of a layout of a ROM bitcell without a transistor in accordance with a particular embodiment of the present invention.

For example, as shown by the circuit 30 in FIG. 3, metalX could be metal3 and metalY could be metal4. The ROM programming could be done using via3. Please note that there are multiple other bitcells and programming combinations which are possible and a designer can always choose metalX, metalY, and programming layer "S" as per the requirements to achieve area, speed, and power targets. Designers should be careful of the EM (electromigration) ratings while choosing the materials and the dimensions.

When the WL is selected, it goes low. When the WL is not selected it becomes tri-stated. One can keep it "high" also when unselected, with a very week PMOS driver if required. The BL is pre-charged high at the start of the read cycle and during active read, the BL pre-charge is shut off. Let's say that the bitcell stores a "zero". That means, the BL and WL are connected. Now, when the WL is OFF, it is high and the BL is also pre-charged high, so it does not fall. If the bitcell stores a "one", there is no connection between the WL and BL and again, the BL does not fall when the WL is OFF.

When the WL goes active or is selected, it goes low and the BL is pre-charged high. If the bitcell stores a "one" (there is no connection), then the BL does not fall. On the other hand, if the bitcell is storing a "zero" (there is a connection between BL and WL), then the BL falls. The BL is then sensed for the data polarity. Simplest way is to use inverter sensing. BL high will be read as a "one" and BL low will be read as a "zero"

This approach has several advantages. The bitcell area is smaller as no device is used. The BL capacitance and WL capacitance are smaller as the device loading is either absent or minimized. Smaller capacitances on WL and BL make this ROM faster. As there is no device in the core cell or bitcell, the PVT (process, voltage, temperature) dependence on the speed, dynamic power, and leakage power reduces drastically. The statistical variation of the bitcell device which has to drive a huge bitline load (in a conventional ROM) is no longer there in the current architecture. All the above five points allow the designer to build high density and high capacity ROMs. As the BL and WL capacitances are smaller, the dynamic power spent on them reduces drastically. When the WL is not selected, both the WL and BL are at VDD and so the core leakage is minimized. Interestingly, either VDD or VSS connection is not required in the core. As the WL and BL capacitances have reduced, the driver sizes in the periphery will also reduce. This will reduce the area, dynamic power, as well as the leakage power. As the effects of the statistical variation of the bitcell are reduced, this architecture will improve the speed as well as the yield.

Figure 4:
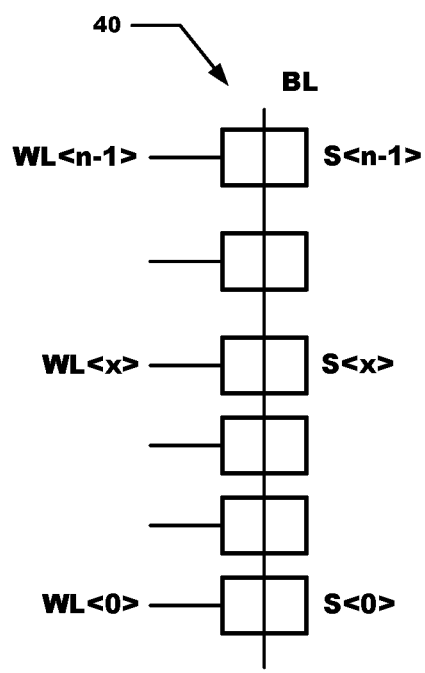
FIG. 4 depicts a schematic diagram of a bitline formed with ROM bitcells without a transistor in accordance with a particular embodiment of the present invention.

Referring now to FIG. 4, a circuit 40 is shown wherein only WL<x> which is the active WL will go low. The remaining WLs will be tri-stated. So if the bitcell of location X is storing a "zero", then only the BL will fall. If the bitcell at X is storing a "one", then the BL will not fall.

While forming a bigger array of ROM bitcells having multiple wordlines and bitlines, it seems necessary using a transistor in the bitcell. We have come up with a new architecture for ROM that will have most of the advantages of the bitcell without a transistor, even if it has a transistor. We will explain the advantages after explaining the architecture.

Figure 5:
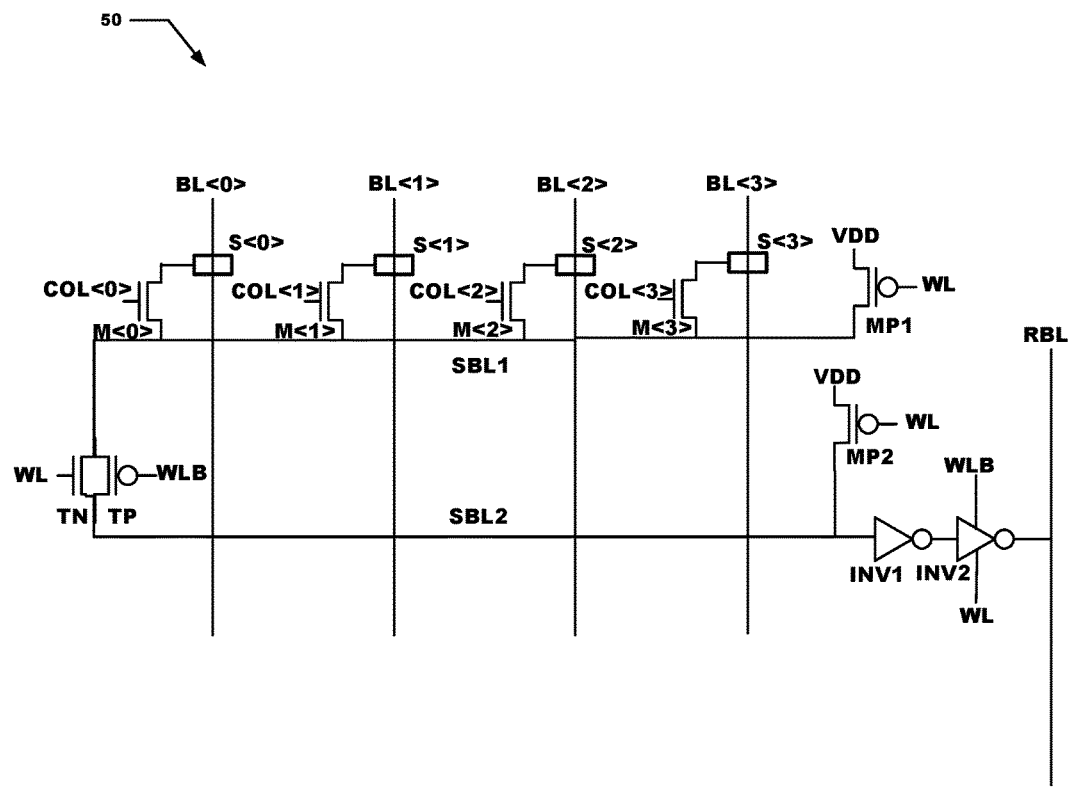
FIG. 5 depicts a schematic diagram of a particular embodiment of a ROM architecture shown for one wordline and one mux.

Referring now to FIG. 5 a ROM architecture 50 for one wordline and one multiplexor (also referred to simply as a mux) is shown. It assumes for illustration here that mux equals 4. The mux can take any value like 4, 8, 16, 32, etc. FIG. 5 shows only one wordline. There would be many such wordlines in a core array. So the WL will be replicated as per the requirement. BL<0-3> are the bitlines. If the bitline is not selected, it will go high. If the bitline is selected, it will be pulled low by a driver in the periphery. COL<0-3> are the column select signals. Only one column will be selected in a cycle within a mux. If the column is selected, for example, COL<0>, it will go high. All other COL<1-3> will stay low. Correspondingly, only M<0> will be ON and M<1-3> will be OFF. S<0-3> are the programming elements in the bitcells. If S<0> is storing a zero, that is, for example, there is a via placed at S<0> connecting the drain of M<0> and BL<0>, then the node SBL1 (sense bitline 1) will go low, otherwise SBL1 will stay high. Note that transistors MP1 and MP2 are pre-charge transistors which pre-charge the nodes SBL1 and SBL2 to high when the corresponding WL is low. When the WL is selected and goes high, transistors MP1 and MP2 are turned OFF. Transistors TN and TP form a transmission gate which is controlled by WL. If the WL is high, then the "zero" on SBL1 will be transferred to SBL2. The "zero" state on SBL2 is then transferred to RBL only if the corresponding WL is high. Note that the WL and WLB tri-state the invertor INV2 if the wordline is not selected. So the RBL (Read Bit Line) will only be actively driven by the sense output from the selected WL and this way, we can uniquely read the selected bitcell contents and drive the RBL accordingly. There is only one RBL per mux. Therefore, RBL represents the Q output for that mux. Note that RBL will be pre-charged high at the start of each cycle.

Figure 6:
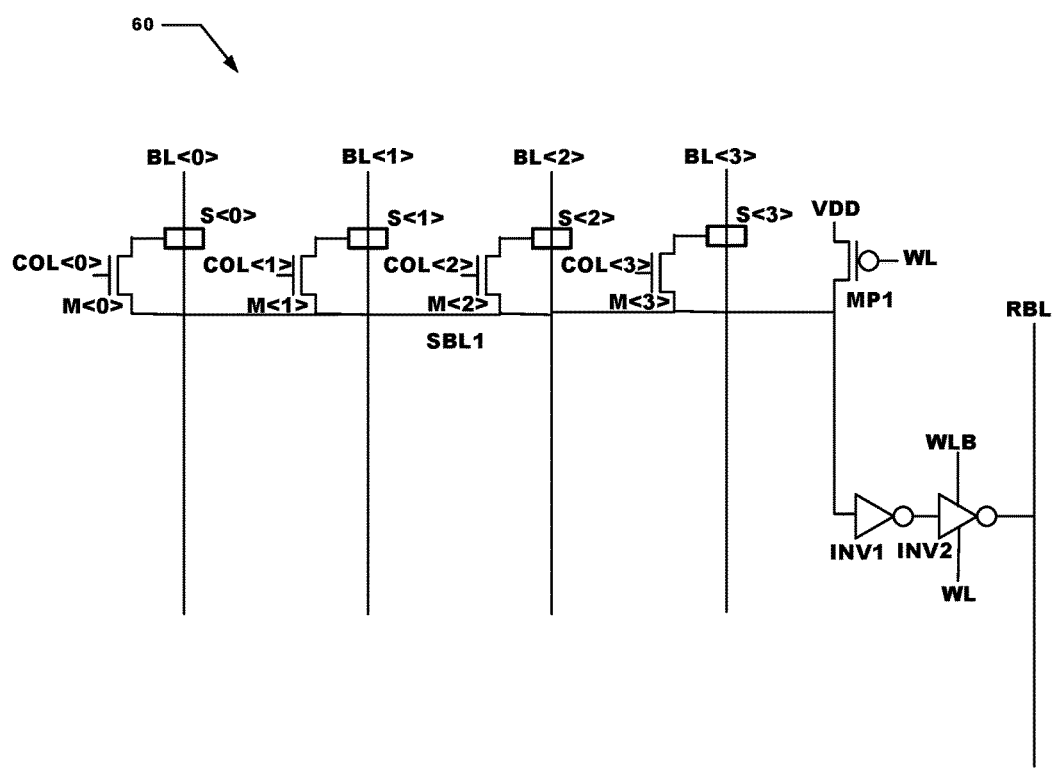
FIG. 6 depicts a schematic diagram showing a first sense scheme for the present ROM architecture in accordance with a particular embodiment of the present invention.

In an alternative scheme which is shown in FIG. 6, as compared to FIG. 5, circuit 60 shows transistors TN, TP, and MP2 have been removed. INV1 now senses SBL1 directly. This reduces the load on WL. It also saves the area as fewer transistors are now needed. In FIG. 6, invertor INV1 is allowed to switch on every row and in every mux. This will add to the dynamic power. Transistors MP1 and invertors INV1 and INV2 can be placed in a small slice after or before each mux. This slice will not take much area.

Figure 7:
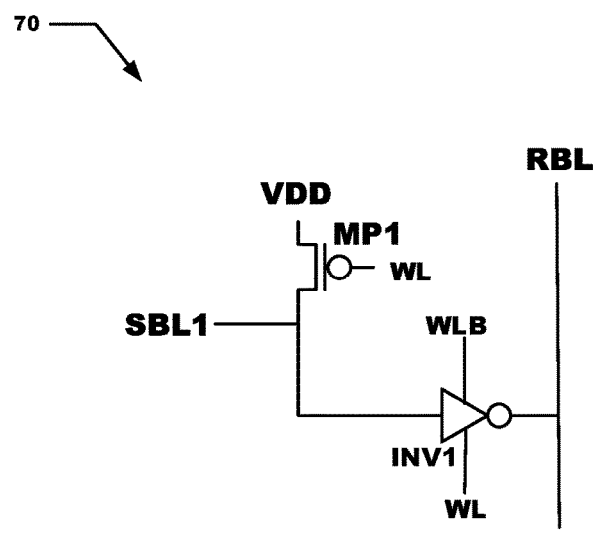
FIG. 7 depicts a schematic diagram showing a second sense scheme for the present ROM architecture in accordance with a particular embodiment of the present invention.

As shown in FIG. 7, circuit 70 features a slightly modified sense scheme. RBL is pre-charged low and when SBL1 goes low, the RBL will be pulled high. In today's technologies, where PMOS is as strong as NMOS, such a scheme can be easily employed.

Figure 8:
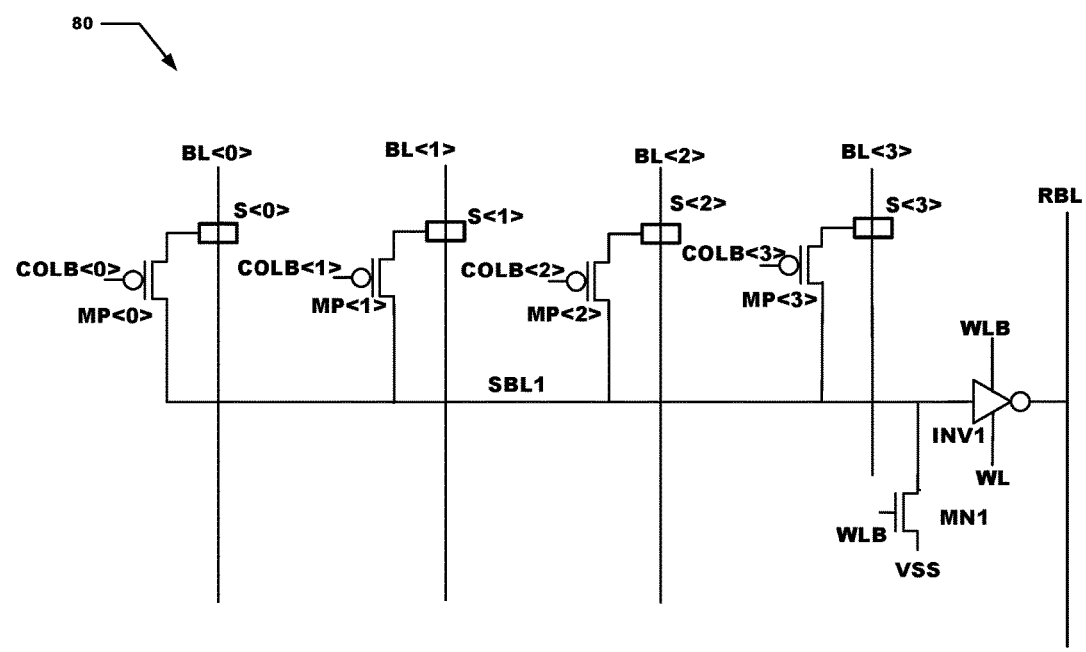
FIG. 8 depicts a schematic diagram showing a ROM architecture using PMOS transistors in the bitcell in accordance with a particular embodiment of the present invention.

Referring now to FIG. 8, another implementation 80 of the presently disclosed ROM architecture using a PMOS transistor in the bitcell is shown. As expected, most of the implementation details are complimentary to the architecture shown in FIG. 6. Here, BL<0-3> are kept low when unselected. When selected, for example, BL<0> goes high. This is done using a CD (column decode) driver in the periphery. Bitcells consist of PMOS transistors MP<0-3>. Column select signals COLB<0-3> stay high when unselected. When selected, for example, COLB<0>, goes low, so that MP<0> transistor turns ON. Now, if S<0> stores a "zero" or a "connection", then the "high" from BL<0> will be transferred to SBL1; otherwise SBL1 will stay low as was pre-charged by transistor MN1. If the corresponding WL is selected or goes "high", then a "high" on SBL1 will result in to a "low" on RBL which was pre-charged high.

Advantages of this ROM architecture include since the bitcell device does not have to drive the BL load, the bitcell device can be sized as small as possible. This reduces the bitcell area. The bitline capacitance that needs to be driven by the bitcell for a read operation (called as SBL1) is very small. When compared with the conventional ROM architectures, they have the bitline capacitance in addition to the column decoder load that needs to be driven by the bitcell. In our architecture, the bitcell effectively needs to drive only the column decode load, that too with the smaller sizes. As is the case, the column decode transistor size in conventional architectures is bigger than the bitcell device size. So effectively, the bitline load in our architecture is negligible. This makes the read operation very fast.

The wordline capacitance is also very small. Referring to FIG. 7, the WL load is only transistor MP1 and INV1 per mux. One mux gives out one bit of the word. So the total load on the WL is number of bits times MP1 and INV1. In the conventional architecture, the WL load is the gate capacitance of all the ROM bitcells on that WL. So again, the wordline capacitance in this architecture is negligible. Smaller capacitances on the SBL1 and WL make this ROM very fast. As the device in the bitcell has to drive negligibly small load, the PVT (Process, Voltage, Temperature) dependence of the speed and power reduces drastically. Also the read speed does not depend on the length of the bitline. So the read speed is almost independent of the number of rows on the bitline. This is a huge advantage of our architecture. The dependence of PPA on the statistical variation of the bitcell device is minimized as the load on it is very small. All the above five points enable the designer to build high density and high capacity ROMs with higher speed. As the BL and WL capacitances are smaller, the dynamic power is reduced. When the WL is not selected, both the BL and the node SBL1 are at the same potential. This will make the core leakage negligible. As the WL capacitance has reduced, it will make the wordline driver sizes smaller. This will reduce the dynamic and leakage power in the periphery. Meeting the speed of our ROM architecture with a conventional ROM architecture will require a multibank architecture with very small RPB (Rows Per Bank) and many banks so that the area of the conventional ROM will just explode.

Figure 9:
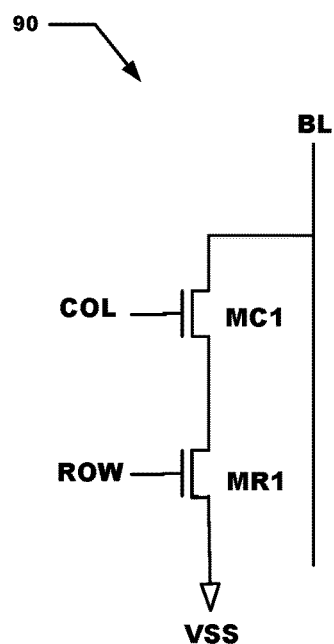
FIG. 9 depicts a schematic diagram showing a ROM bitcell that gives minimum switching in a core array in accordance with a particular embodiment of the present invention.

Referring now to FIG. 9, a circuit 90 is shown having a bitcell with one transistor controlled by the column address and the other series transistor controlled by the row address, then only one bitcell per mux will have the current path to VSS and it will minimize the switching in the core. This will reduce the dynamic power spent on the bitlines during a read operation. It will also reduce the leakage current. The schemes that we will disclose later will further assist in reducing the leakage current. So the architecture discussed under our invention 3 will improve the dynamic and leakage power which is of utmost importance today. It will preserve the area and speed of the conventional architectures.

If both the transistors MC1 and MR1 are used in the bitcell, then the bitcell area will increase. MR1 is controlled by the row address or WL. The scheme shown in FIG. 10 can be used to save the area. Here the transistor MR is placed in the leafcell called WD (Wordline Driver). When the WL is selected, the node XR goes low, thereby providing a path to VSS. When the WL is not selected, node XR is tri-stated and there is no path to VSS. At a time, only one column is selected per mux. So effectively, only one bitcell per mux has a path to VSS. The rest of the sensing scheme, etc. remain same as in the conventional ROMs.

Figure 10:
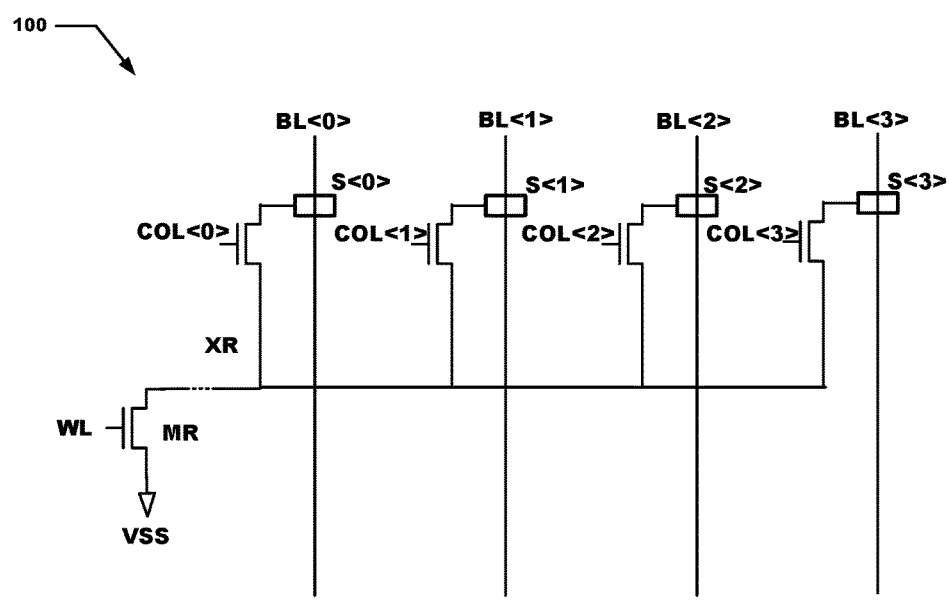
FIG. 10 depicts a schematic diagram showing a ROM architecture that gives minimum switching using common row control in accordance with a particular embodiment of the present invention.
Figure 11:
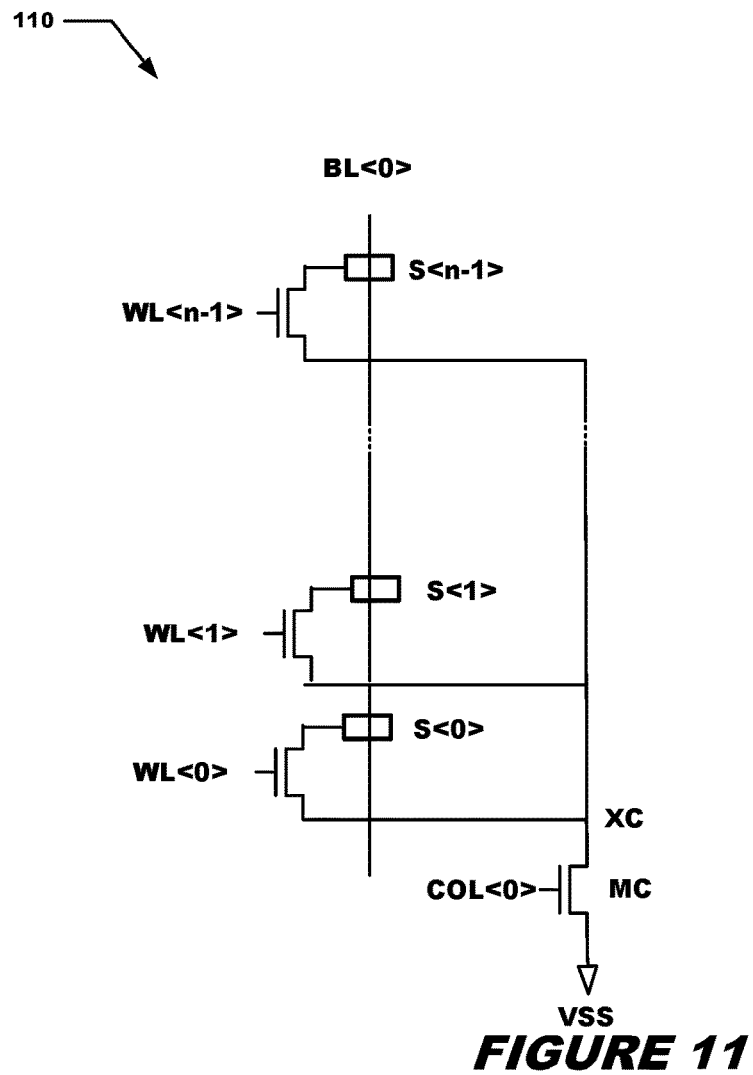
FIG. 11 depicts a schematic diagram showing a ROM architecture that gives minimum switching using common column control in accordance with a particular embodiment of the present invention.

Referring to FIG. 11, circuit 110 shows another way of implementing similar idea to that of FIG. 10. Here the transistor MC is placed at the bottom of each column in a leafcell called CD (Column Decode). When the "COL" is selected, the node XC goes low, thereby providing a path to VSS. When the "COL" is not selected, node XC is tri-stated and there is no path to VSS. At a time, only one WL is selected, so effectively, only one bitcell per mux has a path to VSS. The rest of the sensing scheme, etc. remain same as in the conventional ROMs. Node XR in FIG. 10 and node XC in FIG. 11 may have to be pre-charged high for correct functionality. In both FIG. 10 and FIG. 11, BL are pre-charged high and if the selected bitcell has stored a "zero" then the BL will fall; otherwise not. The bitline is then sensed accordingly.

Unless otherwise stated, use of the word "substantially" may be construed to include a precise relationship, condition, arrangement, orientation, and/or other characteristic, and deviations thereof as understood by one of ordinary skill in the art, to the extent that such deviations do not materially affect the disclosed methods and systems.

Throughout the entirety of the present disclosure, use of the articles "a" or "an" to modify a noun may be understood to be used for convenience and to include one, or more than one of the modified noun, unless otherwise specifically stated.

Elements, components, modules, and/or parts thereof that are described and/or otherwise portrayed through the figures to communicate with, be associated with, and/or be based on, something else, may be understood to so communicate, be associated with, and or be based on in a direct and/or indirect manner, unless otherwise stipulated herein.

Although the methods and systems have been described relative to a specific embodiment thereof, they are not so limited. Obviously many modifications and variations may become apparent in light of the above teachings. Many additional changes in the details, materials, and arrangement of parts, herein described and illustrated, may be made by those skilled in the art.

Having described preferred embodiments of the invention it will now become apparent to those of ordinary skill in the art that other embodiments incorporating these concepts may be used. Accordingly, it is submitted that the invention should not be limited to the described embodiments but rather should be limited only by the spirit and scope of the appended claims.

What is claimed is:

1. A memory circuit comprising:
a plurality of Read Only Memory (ROM) bitcells, each of said bitcells comprising:
   a Column select signal (COL) connection in a first metal layer;
   a Bit Line (BL) connection in a second metal layer;
   a contact Source (S) having a first connection to said BL and having a second connection to the drain of an NMOS transistor; and
   wherein said S is used to provide one of the group consisting of:
   a connection between said BL and said drain of an NMOS transistor; and
   absence of a connection between said BL and said drain of an NMOS transistor; and
   a said NMOS transistor having a gate, a source and a drain, wherein said drain is connected to said second connection of said contact source (S), said gate is connected to a column select signal (COL) and said source is connected to signal Sense Bit Line 1 (SBL1); and
wherein each said source of said plurality of bitcells are connected together.

2. The memory circuit of claim 1 further comprising a first precharge transistor having a gate, a source and a drain, wherein said gate is connected to a Word Line (WL) signal, said source is connected to VDD and said drain is connected to said signal SBL1.

3. The memory circuit of claim 2 further comprising:
a first inverter having an input connected to signal Sense Bit Line 2 (SBL2) and an output; and
a second inverter having an input connected to said output of said first inverter, an output comprising an RBL signal, a first enable coupled to a Word Line Bar (WLB) signal and a second enable coupled to a Word Line (WL) signal.

4. The memory circuit of claim 3 further comprising a transmission gate, said transmission gate comprising:
a first transmission gate NMOS transistor having a gate connected to said WL signal; a source connected to said signal SBL1, and a drain connected to said SBL2; and
a second transmission gate PMOS transistor having a gate connected to said WLB signal; a drain connected to said signal SBL1, and a source connected to said SBL2.

5. The memory circuit of claim 4 further comprising a second precharge transistor having a gate, a source and a drain, wherein said gate is connected to said WL signal, said source is connected to VDD and said drain is connected to said drain of said first transmission gate transistor and said source of said second transmission gate transistor.

6. The memory circuit of claim 5 wherein when said BL is selected, said BL goes low; and
wherein when said BL is not selected, said BL is held high; and
wherein when said BL is selected, said COL signal goes high; and
wherein when said BL is not selected, said COL signal stays low; and
wherein, if the said BL is selected and if said S provides a connection between said BL and said drain of said NMOS transistor, then said SBL1 goes low; and
wherein, if the said BL is selected and if said S does not provide a connection between said BL and said drain of said NMOS transistor, then said SBL1 stays high; and
wherein said SBL1 is pre-charged high at the start of each cycle.

7. The memory circuit of claim 5 wherein said RBL is pre-charged high at the start of each cycle; and
wherein, said RBL goes low if said SBL1 is low and said WL is selected; and
wherein, said RBL stays high if said WL is not selected; and
wherein, said RBL stays high if said SBL1 is high and said WL is selected.

8. The memory circuit of claim 5 wherein there is only one said RBL per mux and the final output Q_A can be taken from said RBL directly or with buffering and keeper latch.

9. The memory circuit of claim 5 wherein the maximum number of bitcells in a row-slice can be equal to the number of column mux factor used.

10. The memory circuit of claim 5 wherein the minimum number of row-slices in a row equals the number of bits.

11. The memory circuit of claim 5 wherein only one sense input is generated for said row-slice and only one sense output is generated for said row-slice.

12. The memory circuit of claim 1 further comprising:
a first inverter having an input connected to signal Sense Bit Line 1 (SBL1) and an output; and
a second inverter having an input connected to said output of said first inverter, an output comprising an RBL signal, a first enable coupled to a Word Line Bar (WLB) signal and a second enable coupled to a Word Line (WL) signal; and
a first precharge transistor having a gate connected to a WL signal, a source connected to VDD and a drain connected to said input of said first inverter.

13. The memory circuit of claim 1 further comprising:
a first inverter having an input connected to signal Sense Bit Line 1 (SBL1), an output comprising an RBL signal, a first enable coupled to a Word Line Bar (WLB) signal and a second enable coupled to a Word Line (WL) signal; and
a first precharge transistor having a gate connected to a WL signal, a source connected to VDD and a drain connected to said input of said first inverter.

14. A memory circuit comprising:
a plurality of Read Only Memory (ROM) bitcells, each of said bitcells comprising:
   a Column select Bar signal (COLB) connection in a first metal layer;
   a Bit Line (BL) connection in a second metal layer;
   a contact Source (S) having a first connection to said BL and having a second connection to the drain of a PMOS transistor; and
   wherein said S is used to provide one of the group consisting of:
   a connection between said BL and said drain of a PMOS transistor; and
   absence of a connection between said BL and said drain of a PMOS transistor; and
   said PMOS transistor having a gate, a source and a drain, wherein said drain is connected to said second connection of said contact source (S), said gate is connected to a Column select Bar signal (COLB) and said source is connected to signal Sense Bit Line 1 (SBL1); and
wherein each said source of said plurality of bitcells are connected together.

15. The memory circuit of claim 14 further comprising:
a first inverter having an input connected to signal Sense Bit Line 1 (SBL1), an output comprising an RBL signal, a first enable coupled to a Word Line Bar (WLB) signal and a second enable coupled to a Word Line (WL) signal; and a first precharge transistor having a gate connected to a WLB signal, a source connected to VSS and a drain connected to said input of said first inverter.

16. The memory circuit of claim 15 wherein when said BL is selected, said BL goes high; and wherein when said BL is not selected, said BL is held low; and wherein when said BL is selected, said COLB signal goes low; and wherein when said BL is not selected, said COLB signal stays high; and wherein, if the said BL is selected and if said S provides a connection between said BL and said source of said PMOS transistor, then said SBL1 goes high; and wherein, if the said BL is selected and if said S does not provide a connection between said BL and said source of said PMOS transistor, then said SBL1 stays low; and wherein said SBL1 is pre-charged low at the start of each cycle.

17. The memory circuit of claim 15 wherein said RBL is pre-charged high at the start of each cycle; and wherein, said RBL goes low if said SBL1 is high and said WL is selected; and wherein, said RBL stays high if said WL is not selected; and wherein, said RBL stays high if said SBL1 is low and said WL is selected.

\* \* \* \* \*